United States Patent
Yang

(10) Patent No.: US 12,531,531 B2
(45) Date of Patent: Jan. 20, 2026

(54) HIGH-LINEARITY DYNAMIC AMPLIFIER

(71) Applicant: Chengdu Sino Microelectronics Technology Co., Ltd., Chengdu (CN)

(72) Inventor: Jinda Yang, Chengdu (CN)

(73) Assignee: Chengdu Sino Microelectronics Technology Co., Ltd., Chengdu (CN)

( * ) Notice: Subject to any disclaimer, the term of this patent is extended or adjusted under 35 U.S.C. 154(b) by 469 days.

(21) Appl. No.: 18/109,870

(22) Filed: Feb. 15, 2023

(65) Prior Publication Data
US 2023/0268898 A1    Aug. 24, 2023

(30) Foreign Application Priority Data
Feb. 24, 2022  (CN) .......................... 202210173167.2

(51) Int. Cl.
*H03F 3/45* (2006.01)
*H03F 1/32* (2006.01)

(52) U.S. Cl.
CPC ....... *H03F 3/45273* (2013.01); *H03F 1/3211* (2013.01); *H03F 3/45744* (2013.01)

(58) Field of Classification Search
CPC ............... H03F 3/45273; H03F 1/3211; H03F 3/45744; H03F 2203/45031; H03F 2203/45318; H03F 2203/45366; H03F 2203/45551; H03F 2203/5033; H03F 3/45179; H03F 3/505; H03F 2203/45051

USPC .................................................. 330/252–261
See application file for complete search history.

(56) References Cited

U.S. PATENT DOCUMENTS 6,885,245 B2 * 4/2005 Liu ..................... H03F 3/45179
                                                    330/253
8,963,641 B1 * 2/2015 Liu ..................... H03F 3/45475
                                                    330/261

* cited by examiner

*Primary Examiner* — Hieu P Nguyen
(74) *Attorney, Agent, or Firm* — Bayramoglu Law Offices

(57) ABSTRACT

A high-linearity dynamic amplifier includes a first differential branch and a second differential branch. The first differential branch includes a first MOS transistor and a second MOS transistor which are connected between a high-level terminal and a ground-level terminal in series. A connection point of the first MOS transistor and the second MOS transistor is a second output terminal. The second differential branch includes a third MOS transistor and a fourth MOS transistor which are connected between the high-level terminal and the ground-level terminal in series. A connection point of the third MOS transistor and the fourth MOS transistor is a first output terminal. A grid terminal of the second MOS transistor is connected to a drain terminal of the fourth MOS transistor. A grid terminal of the fourth MOS transistor is connected to a drain terminal of the second MOS transistor.

2 Claims, 5 Drawing Sheets

HIGH-LINEARITY DYNAMIC AMPLIFIER

CROSS REFERENCE TO THE RELATED APPLICATIONS

This application is based upon and claims priority to Chinese Patent Application No. 202210173167.2, filed on Feb. 24, 2022, the entire contents of which are incorporated herein by reference.

TECHNICAL FIELD

The present invention relates to an integrated circuit technology, and in particular to a dynamic amplifier.

BACKGROUND

At present, one of the modules with the most challenging and difficult design in a high-speed analog-to-digital converter is a module configured to process signal amplification. The signal amplification module requires high linearity and high-speed amplification output no matter being in interstage gain amplification in a production line or signal amplification of a preceding-stage sampling and holding circuit. The traditional dynamic amplifier based on an open-loop mode generally adopt various linearization (such as source degeneration) and bandwidth expansion methods to improve the linearity and speed of signal amplification. For example, an open-loop operational amplifier based on a phase inverter structure (or various solutions improved based on the phase inverter structure has the characteristics of simple structure, low noise, high amplification speed and medium linearity, and has the disadvantage that input requires a high common-mode voltage which is generally half of a power voltage, as shown in FIG. 1. If the preceding stage is the sampling and holding circuit, the structure increases the design difficulty of a sampling and holding clock. As shown in FIG. 2, when the common mode of an input signal is Vcm, the common-mode voltage of the sampling clock should also integrally boost Vcm. For the clock, the boosted Vcm needs to be realized by Bootstrap or other AC coupling modes, which is very difficult to realize for the high-speed clock reaching 10 GSPS or higher.

To reduce the design difficulty of the high-speed sampling clock, a high-speed signal buffer used by IBM and other companies also adopts a circuit shown in FIG. 3, which gives up a signal amplification function and buffers and outputs the original signal after sampling and holding directly through a source-followed circuit structure.

The front-terminal sampling and holding circuit designed by the source-followed buffer is shown in FIG. 4. Since PMOS is used as a source follower, the input common-mode voltage may be as low as AGND. Therefore, the sampling clock may boost the voltage without grid pressure bootstrap or capacitance coupling, so that sampling with 10 GSPS or even higher speed can be realized.

The solution has the disadvantages that a signal cannot be amplified due to source following, even the amplified is shortened due to substrate bias effect, so that the design difficulty of a post-stage circuit is increased.

At present, the representative companies in the field of high-speed converters include ADI, TI, Broadcom, IBM and the like in the United States, all of which have self-developed high-speed amplifiers or buffers.

As mentioned above, an existing high-speed signal buffer mainly has the disadvantages of high input common-mode voltage or inability to amplify signals; meanwhile, the above types of buffers have poor linearity.

SUMMARY

A technical problem to be solved by the present invention is to provide a high-linearity dynamic amplifier, which can reduce an input common-mode voltage, amplify an input signal and maintain high linearity.

The technical solution adopted by the present invention to solve the technical problem is: a high-linearity dynamic amplifier includes a first differential branch and a second differential branch, wherein the first differential branch includes a first MOS transistor and a second MOS transistor which are connected between a high-level terminal and a ground-level terminal in series, and a connection point of the first MOS transistor and the second MOS transistor is a second output terminal;

the second differential branch includes a third MOS transistor and a fourth MOS transistor which are connected between the high-level terminal and the ground-level terminal in series, and a connection point of the third MOS transistor and the fourth MOS transistor is a first output terminal;

a grid terminal of the second MOS transistor is connected to a drain terminal of the fourth MOS transistor, and a grid terminal of the fourth MOS transistor is connected to a drain terminal of the second MOS transistor; and a grid terminal of the first MOS transistor is connected to one input terminal of the amplifier, and a grid terminal of the third MOS transistor is connected to the other input terminal of the amplifier.

The beneficial effects of the present invention are:

1. The input common mode is very low, and the problem of a high-speed sampling clock drive circuit can be completely solved.

2. A dynamic amplification speed is higher than that of the traditional closed-loop operational amplifier.

3. The amplifier has higher linearity than that of the traditional open-loop operational amplifier.

DETAILED DESCRIPTION OF THE EMBODIMENTS

Embodiment 1

Figure 6:
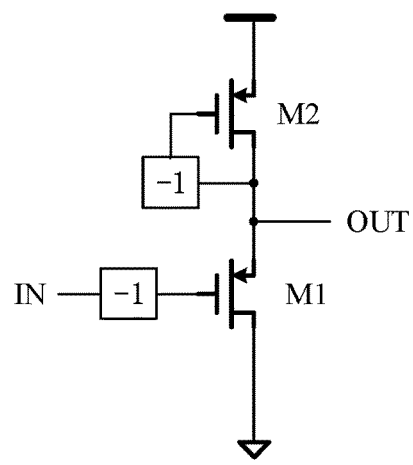
FIG. 6 is a circuit diagram of a single-terminal circuit according to Embodiment 1.
Figure 7:
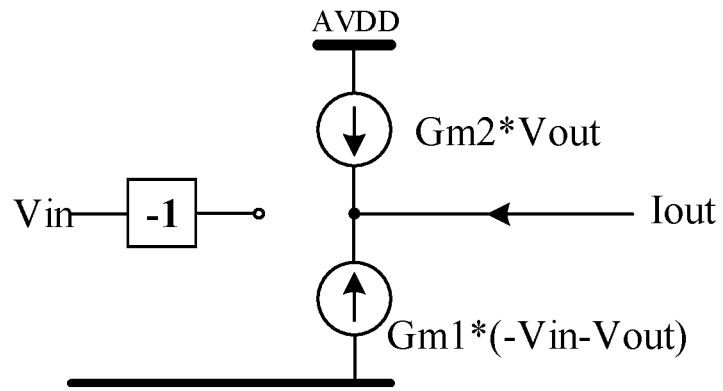
FIG. 7 is an equivalent model diagram of a single-terminal small signal according to Embodiment 1.
Figure 8:
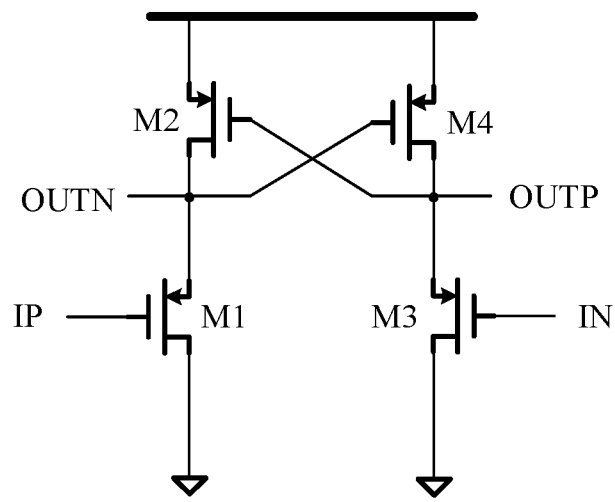
FIG. 8 is a circuit diagram of Embodiment 1.

Referring to FIG. 6 to FIG. 8, this embodiment is a differential open-loop dynamic operational amplifier circuit, including a first differential branch and a second differential branch, wherein the first differential branch includes a first MOS transistor M1 and a second MOS transistor M2 which are connected between a high-level terminal and a ground-level terminal in series, and a connection point of the first MOS transistor M1 and the second MOS transistor M2 is a second output terminal;

the second differential branch includes a third MOS transistor M3 and a fourth MOS transistor M4 which are connected between the high-level terminal and the ground-level terminal in series, and a connection point of the third MOS transistor M3 and the fourth MOS transistor M4 is a first output terminal;

a grid terminal of the second MOS transistor M2 is connected to a drain terminal of the fourth MOS transistor M4, and a grid terminal of the fourth MOS transistor M4 is connected to a drain terminal of the second MOS transistor M2; and a grid terminal of the first MOS transistor M1 is connected to one input terminal of the amplifier, and a grid terminal of the third MOS transistor M3 is connected to the other input terminal of the amplifier.

The first MOS transistor M1, the second MOS transistor M2, the third MOS transistor M3 and the fourth MOS transistor M4 are all PMOS transistors;

a source terminal of the second MOS transistor M2 is connected to the high-level terminal, and the drain terminal of the second MOS transistor is connected to a source terminal of the first MOS transistor M1;

a drain terminal of the first MOS transistor M1 is connected to the ground-level terminal;

a source terminal of the fourth MOS transistor M4 is connected to the high-level terminal, and the drain terminal of the fourth MOS transistor is connected to a source terminal of the third MOS transistor M3; and a drain terminal of the third MOS transistor M3 is connected to the ground-level terminal.

All the MOS transistors are PMOS transistors.

Figure 1:
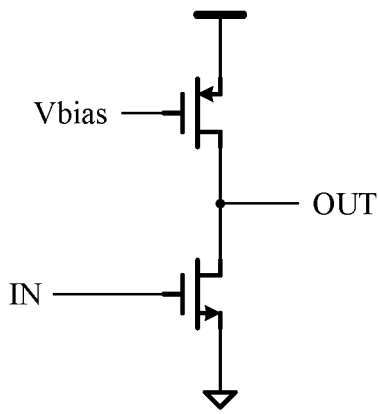
FIG. 1 is a circuit diagram of a basic common-source amplifier.
Figure 2:
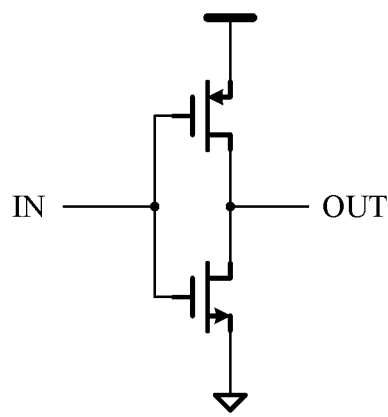
FIG. 2 is a circuit diagram of an operational amplifier of the original phase inverter structure.
Figure 3:
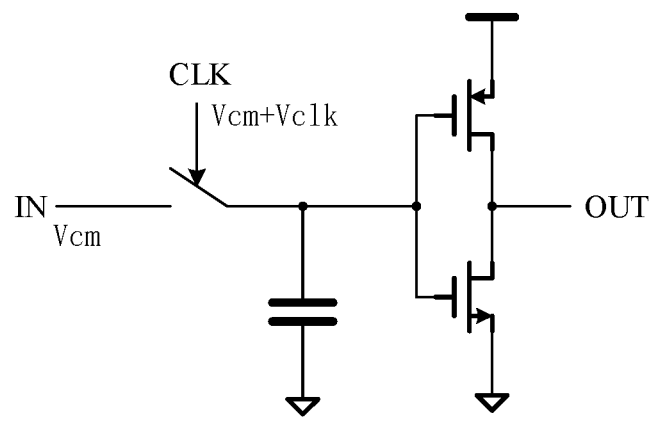
FIG. 3 is a circuit diagram of a preceding-stage sampling and holding circuit of a dynamic operational amplifier based on a phase inverter structure.
Figure 4:
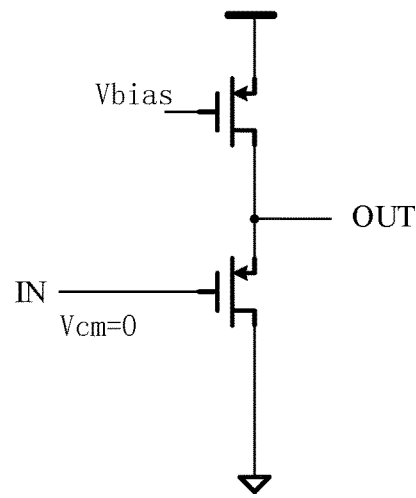
FIG. 4 is a circuit diagram of a source-followed buffer.
Figure 5:
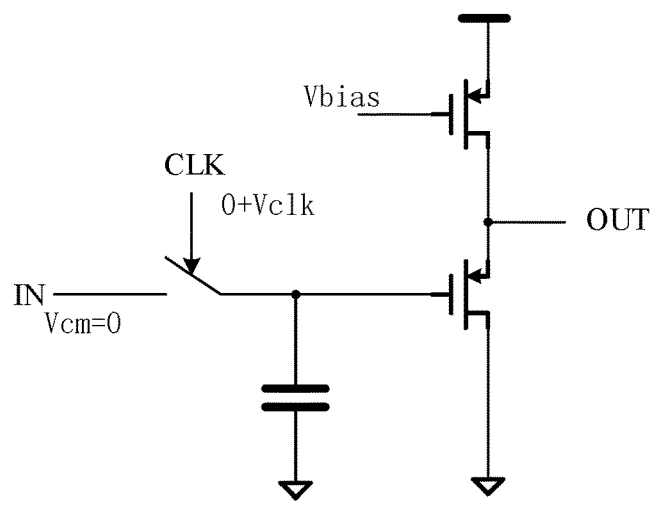
FIG. 5 is a circuit diagram of a sampling and holding circuit based on a source-followed high-speed buffer.

It can be calculated from FIG. 7 that a small signal output current is:

$$I_{out}=G_{m1}V_{in}+(G_{m1}-G_{m2})V_{out}$$

when $G_{m1}=G_{m2}$, the above formula may be simplified as:

$$I_{out}=G_{m1}V_{in}$$

it can be seen from the small signal expression that the present invention is completely consistent with the amplification effect of a basic common-source amplifier based on FIG. 1, but an input common mode is lower, so that the preceding-stage sampling clock may be driven by a simple CMOS buffer without grid pressure bootstrap or AC coupling. On one hand, the area is reduced, and more importantly, the frequency of the sampling clock can be increased. The differential implementation form of a single-terminal circuit shown in FIG. 6 is shown in FIG. 8.

Embodiment 2

Figure 9:
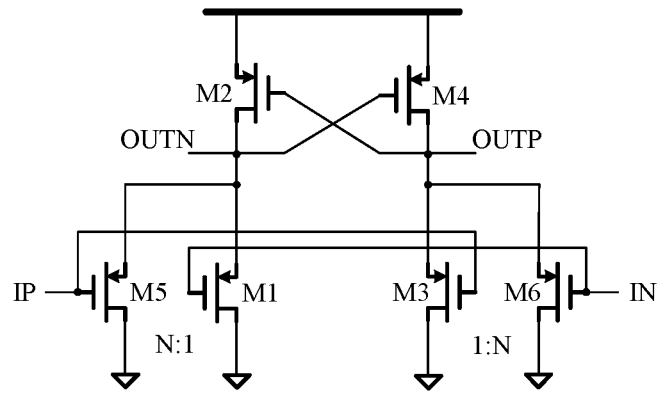
FIG. 9 is a circuit diagram of Embodiment 2.

To improve the linearity of the dynamic operational amplifier and as an improvement of Embodiment 1, a pair of cross coupling transistors are added to the input, and the cubic term of a differential input transistor is counteracted by the primary item of the cross coupling transistors, as shown in FIG. 9.

Specifically, on the basis of Embodiment 1 shown in FIG. 8, the following PMOS transistor is added:

a fifth MOS transistor M5, wherein a grid terminal of the fifth MOS transistor is connected to a first input terminal, a source terminal of the fifth MOS transistor is connected to the second output terminal, and a drain terminal of the fifth MOS transistor is connected to the ground-level terminal; and a sixth MOS transistor M6, wherein a grid terminal of the sixth MOS transistor is connected to a second input terminal, a source terminal of the sixth MOS transistor is connected to the first output terminal, and a drain terminal of the sixth MOS transistor is connected to the ground-level terminal;

the grid terminal of the first MOS transistor M1 is connected to the second input terminal, and the grid terminal of the third MOS transistor M3 is connected to the first input terminal; and the first input terminal and the second input terminal are two input terminals of the amplifier.

Figure 10:
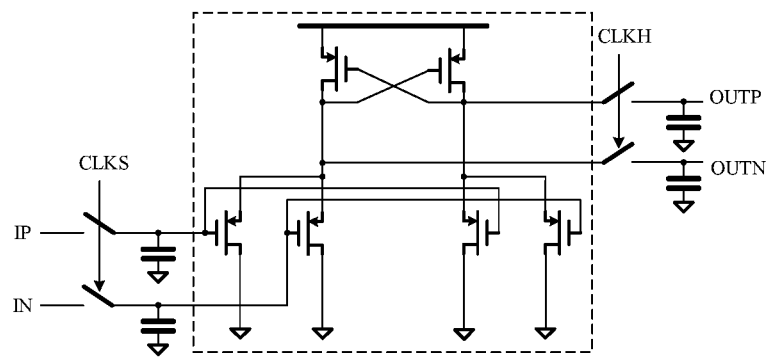
FIG. 10 is an integrated circuit diagram including preceding and post stages of Embodiment 2.

FIG. 10 is an integrated circuit diagram including preceding and post stages of this embodiment. The preceding stage of the dynamic amplifier is a sampling and holding circuit, and CLKS is a full-speed sampling clock. Since the input common mode is low, CLKS may be driven directly by a CMOS buffer, and the sampling speed of CLKS may reach 10 GSPS or even higher.

Embodiment 3

Figure 11:
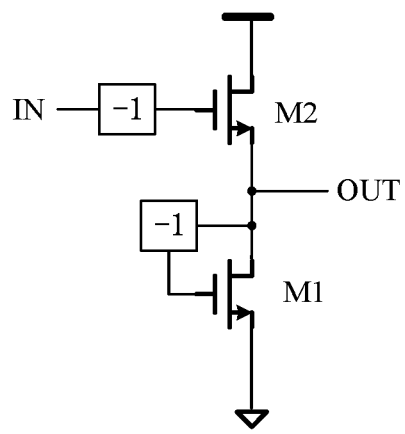
FIG. 11 is a circuit diagram of a single-terminal circuit according to Embodiment 3.
Figure 12:
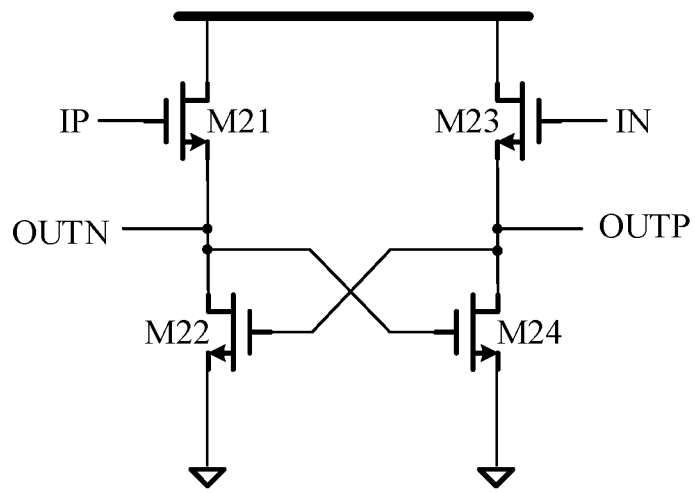
FIG. 12 is a circuit diagram of Embodiment 3.

FIG. 11 shows a single-terminal circuit of this embodiment, and FIG. 12 shows a differential implementation.

The high-linearity dynamic amplifier in this embodiment includes a first differential branch and a second differential branch, wherein the first differential branch includes a first MOS transistor M21 and a second MOS transistor M22 which are connected between a high-level terminal and a ground-level terminal in series, and a connection point of the first MOS transistor M21 and the second MOS transistor M22 is a second output terminal;

the second differential branch includes a third MOS transistor M23 and a fourth MOS transistor M24 which are connected between the high-level terminal and the ground-level terminal in series, and a connection point of the third MOS transistor M23 and the fourth MOS transistor M24 is a first output terminal;

a grid terminal of the second MOS transistor M22 is connected to a drain terminal of the fourth MOS transistor M24, and a grid terminal of the fourth MOS transistor M24 is connected to a drain terminal of the second MOS transistor M22; and a grid terminal of the first MOS transistor M21 is connected to one input terminal of the amplifier, and a grid terminal of the third MOS transistor M23 is connected to the other input terminal of the amplifier.

The first MOS transistor M21, the second MOS transistor M22, the third MOS transistor M23 and the fourth MOS transistor M24 are all NMOS transistors;

a source terminal of the second MOS transistor M22 is connected to the ground-level terminal, and the drain terminal of the second MOS transistor is connected to a source terminal of the first MOS transistor M21;

a drain terminal of the first MOS transistor M21 is connected to the high-level terminal;

a source terminal of the fourth MOS transistor M24 is connected to the ground-level terminal, and the drain terminal of the fourth MOS transistor is connected to a source terminal of the third MOS transistor M23; and a drain terminal of the third MOS transistor M23 is connected to the high-level terminal.

All the MOS transistors are NMOS transistors.

Embodiment 4

Figure 13:
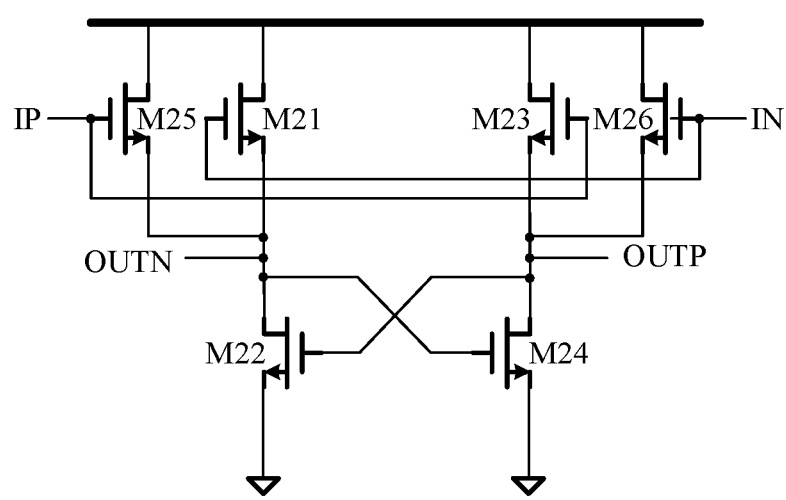
FIG. 13 is a circuit diagram of Embodiment 4.

Referring to FIG. 13, similar to Embodiment 2, this embodiment is an improvement of Embodiment 3, and on the basis of Embodiment 3, the following NMOS transistor is added:

a fifth MOS transistor M25, wherein a grid terminal of the fifth MOS transistor is connected to a first input terminal, a source terminal of the fifth MOS transistor is connected to the second output terminal, and a drain terminal of the fifth MOS transistor is connected to the high-level terminal; and a sixth MOS transistor M26, wherein a grid terminal of the sixth MOS transistor is connected to a second input terminal, a source terminal of the sixth MOS transistor is connected to the first output terminal, and a drain terminal of the sixth MOS transistor is connected to the high-level terminal;

the grid terminal of the first MOS transistor M21 is connected to the second input terminal, and the grid terminal of the third MOS transistor M23 is connected to the first input terminal; and the first input terminal and the second input terminal are two input terminals of the amplifier.

What is claimed is:

1. A high-linearity dynamic amplifier, comprising:
a first differential branch and a second differential branch, wherein
the first differential branch comprises a first metal oxide semiconductor (MOS) transistor and a second MOS transistor, wherein the first MOS transistor and the second MOS transistor are connected between a high-level terminal and a ground-level terminal in series, and a connection point of the first MOS transistor and the second MOS transistor is a second output terminal;
the second differential branch comprises a third MOS transistor and a fourth MOS transistor, wherein the third MOS transistor and the fourth MOS transistor are connected between the high-level terminal and the ground-level terminal in series, and a connection point of the third MOS transistor and the fourth MOS transistor is a first output terminal;
a grid terminal of the second MOS transistor is connected to a drain terminal of the fourth MOS transistor, and a grid terminal of the fourth MOS transistor is connected to a drain terminal of the second MOS transistor;
a grid terminal of the first MOS transistor is connected to one input terminal of the high-linearity dynamic amplifier, and a grid terminal of the third MOS transistor is connected to the other input terminal of the high-linearity dynamic amplifier;
the first MOS transistor, the second MOS transistor, the third MOS transistor and the fourth MOS transistor are P-channel metal oxide semiconductor (PMOS) transistors;

a source terminal of the second MOS transistor is connected to the high-level terminal, and the drain terminal of the second MOS transistor is connected to a source terminal of the first MOS transistor;

a drain terminal of the first MOS transistor is connected to the ground-level terminal;

a source terminal of the fourth MOS transistor is connected to the high-level terminal, and the drain terminal of the fourth MOS transistor is connected to a source terminal of the third MOS transistor; and a drain terminal of the third MOS transistor is connected to the ground-level terminal;

a fifth MOS transistor, wherein a grid terminal of the fifth MOS transistor is connected to a first input terminal, a source terminal of the fifth MOS transistor is connected to the second output terminal, and a drain terminal of the fifth MOS transistor is connected to the ground-level terminal; and a sixth MOS transistor, wherein a grid terminal of the sixth MOS transistor is connected to a second input terminal, a source terminal of the sixth MOS transistor is connected to the first output terminal, and a drain terminal of the sixth MOS transistor is connected to the ground-level terminal;

wherein the grid terminal of the first MOS transistor is connected to the second input terminal, and the grid terminal of the third MOS transistor is connected to the first input terminal;

the fifth MOS transistor and the sixth MOS transistor are PMOS transistors, and the first input terminal and the second input terminal are two input terminals of the high-linearity dynamic amplifier.

2. A high-linearity dynamic amplifier, comprising:
a first differential branch and a second differential branch, wherein
the first differential branch comprises a first metal oxide semiconductor (MOS) transistor and a second MOS transistor, wherein the first MOS transistor and the second MOS transistor are connected between a high-level terminal and a ground-level terminal in series, and a connection point of the first MOS transistor and the second MOS transistor is a second output terminal;
the second differential branch comprises a third MOS transistor and a fourth MOS transistor, wherein the third MOS transistor and the fourth MOS transistor are connected between the high-level terminal and the ground-level terminal in series, and a connection point of the third MOS transistor and the fourth MOS transistor is a first output terminal;
a grid terminal of the second MOS transistor is connected to a drain terminal of the fourth MOS transistor, and a grid terminal of the fourth MOS transistor is connected to a drain terminal of the second MOS transistor;
a grid terminal of the first MOS transistor is connected to one input terminal of the high-linearity dynamic amplifier, and a grid terminal of the third MOS transistor is connected to the other input terminal of the high-linearity dynamic amplifier;
the first MOS transistor, the second MOS transistor, the third MOS transistor and the fourth MOS transistor are N-channel metal oxide semiconductor (NMOS) transistors;
a source terminal of the second MOS transistor is connected to the ground-level terminal, and the drain terminal of the second MOS transistor is connected to a source terminal of the first MOS transistor;

a drain terminal of the first MOS transistor is connected to the high-level terminal;

a source terminal of the fourth MOS transistor is connected to the ground-level terminal, and the drain terminal of the fourth MOS transistor is connected to a source terminal of the third MOS transistor; and a drain terminal of the third MOS transistor is connected to the high-level terminal;

a fifth MOS transistor, wherein a grid terminal of the fifth MOS transistor is connected to a first input terminal, a source terminal of the fifth MOS transistor is connected to the second output terminal, and a drain terminal of the fifth MOS transistor is connected to the high-level terminal; and a sixth MOS transistor, wherein a grid terminal of the sixth MOS transistor is connected to a second input terminal, a source terminal of the sixth MOS transistor is connected to the first output terminal, and a drain terminal of the sixth MOS transistor is connected to the high-level terminal;

wherein the grid terminal of the first MOS transistor is connected to the second input terminal, and the grid terminal of the third MOS transistor is connected to the first input terminal;

the fifth MOS transistor and the sixth MOS transistor are NMOS transistors; and the first input terminal and the second input terminal are two input terminals of the high-linearity dynamic amplifier.

* * * * *